United States Patent
Arakawa

(10) Patent No.: US 9,076,531 B2
(45) Date of Patent: Jul. 7, 2015

(54) MEMORY DEVICE AND REDUNDANCY METHOD THEREOF

(71) Applicant: Nuvoton Technology Corporation, Hsinchu (TW)

(72) Inventor: Kenichi Arakawa, Chiba (JP)

(73) Assignee: Winbond Electronics Corp., Taichung (TW)

( * ) Notice: Subject to any disclaimer, the term of this patent is extended or adjusted under 35 U.S.C. 154(b) by 102 days.

(21) Appl. No.: 13/846,583

(22) Filed: Mar. 18, 2013

(65) Prior Publication Data

US 2013/0336060 A1    Dec. 19, 2013

(30) Foreign Application Priority Data

Jun. 13, 2012    (JP) .................................. 2012-133521

(51) Int. Cl.
| | | |
|---|---|---|
| G11C 7/00 | (2006.01) | |
| G11C 16/06 | (2006.01) | |
| G11C 29/00 | (2006.01) | |
| G11C 16/04 | (2006.01) | |

(52) U.S. Cl.
    CPC ................ *G11C 16/06* (2013.01); *G11C 16/04* (2013.01); *G11C 29/82* (2013.01)

(58) Field of Classification Search
    CPC ........ G11C 16/06; G11C 29/82; G11C 16/04; G11C 16/0483
    USPC .................................... 365/185.09, 200, 201
    See application file for complete search history.

(56) References Cited

U.S. PATENT DOCUMENTS

| | | | | |
|---|---|---|---|---|
| 5,355,339 | A | * | 10/1994 | Oh et al. ........................ 365/200 |
| 5,784,321 | A | * | 7/1998 | Yamamura .................... 365/200 |
| 5,808,944 | A | * | 9/1998 | Yoshitake et al. ............. 365/200 |
| 5,828,599 | A | * | 10/1998 | Herdt ........................ 365/185.08 |
| 2002/0039311 | A1 | * | 4/2002 | Takeuchi et al. ......... 365/185.09 |
| 2005/0018483 | A1 | * | 1/2005 | Imamiya et al. .......... 365/185.09 |
| 2006/0018157 | A1 | * | 1/2006 | Kawai ...................... 365/185.09 |
| 2007/0016738 | A1 | * | 1/2007 | Hosono et al. ................. 711/156 |
| 2009/0161429 | A1 | * | 6/2009 | Chen et al. ............... 365/185.09 |
| 2010/0107004 | A1 | | 4/2010 | Bottelli et al. |

(Continued)

FOREIGN PATENT DOCUMENTS

| | | |
|---|---|---|
| JP | 2001-176290 | 6/2001 |
| JP | 2003-085994 | 3/2003 |
| JP | 2006-323923 | 11/2006 |
| JP | 2008-165799 | 7/2008 |
| JP | 2009-043389 | 2/2009 |

(Continued)

OTHER PUBLICATIONS

Taiwanese Office Action dated Nov. 26, 2014, as issued in corresponding Taiwan Patent Application No. 101133607 (9 pages).

*Primary Examiner* — Connie Yoha
(74) *Attorney, Agent, or Firm* — Muncy, Geissler, Olds & Lowe, P.C.

(57) ABSTRACT

A memory device includes at least one memory, a controller controlling the at least one memory and a connect unit. The at least one memory includes a memory region comprising a plurality of memory cells, a redundant memory region comprising a plurality of memory cells and a redundancy information memory unit. The redundancy information memory unit stores redundancy information of the memory cells of the memory region. The controller includes a control unit. The control unit controls data read-out from the at least one memory and data to be written-in to the at least one memory according to the redundancy information stored in the redundancy information memory unit.

11 Claims, 11 Drawing Sheets

(56) References Cited

U.S. PATENT DOCUMENTS

2011/0069549 A1* 3/2011 Tokiwa .................... 365/185.09
2013/0242655 A1* 9/2013 Tsai ........................ 365/185.09

FOREIGN PATENT DOCUMENTS

KR        20040003838 A    1/2004
WO    WO2011/089835 A1    7/2011

\* cited by examiner

| Defective Cell | | Redundant Cell |
|---|---|---|
| Memory Block | Column Address | Column Address |
| Block(0) | MMAD5 | MRAD1 |
| Block(1) | MMAD2 | MRAD2 |
| ... | ... | ... |
| Block(m-1) | MMAD21 | MRAD5 |

MEMORY DEVICE AND REDUNDANCY METHOD THEREOF

CROSS REFERENCE TO RELATED APPLICATIONS

This application claims priority of Japan Patent Application No. 2012-133521, filed on Jun. 13, 2012, the entirety of which is incorporated by reference herein.

BACKGROUND OF THE INVENTION

1. Field of the Invention

The invention relates to a semiconductor memory device and more particularly, to a redundancy region of a NAND type flash memory.

2. Description of the Related Art

A NAND type flash memory comprises a memory consisting of a plurality of blocks, each of which comprises a plurality of NAND strings arranged in a row direction. The NAND string comprises a plurality of memory cells connected in serial and select transistors provided at two ends of the NAND string. One end of the NAND string is connected to a bit line through one of the select transistors, and the other end of the NAND string is connected to a source line through the other one of the select transistors. Reading-out and writing-in (programming) of data are performed through the bit line connected to the NAND string.

As for semiconductor memories, such as a flash memory, a dynamic random access memory, and so on, since integration has continually increased, the difficulty in manufacturing memory elements without failures or defects has consequently risen. Accordingly, to compensate for physical defects in memory elements during the manufacturing process, redundancy schemes are used in memory chips. For example, some redundancy schemes comprise a convert circuit and a redundant memory region. The convert circuit converts addresses of memory elements having physical defects into addresses of memory elements of the redundant memory region, and the redundant memory region is used to compensate for the memory elements having physical defects. When a memory chip is tested or ready for shipment, address information of the memory elements having physical defects and the memory elements of the redundant memory region is stored in a fuse ROM or a storage element, such as a register. After that, when an address of a defective memory element is input, the address is detected, and the access to the defective memory element is forbidden and a corresponding memory element of the redundant memory region is accessed instead. Therefore, appearance-wise, a memory device with a defective memory element therein, will not be noticeable (for example, Patent Document 1 and 2). In summary, though defects may exist in a small number of memory elements, the memory chip may still be deemed as a qualified product because of the redundancy scheme. Therefore, yield rates would not necessarily drop and memory device costs would not necessarily rise.

RELATED PATENT DOCUMENTS

[Patent Document 1] JP 2000-311496
[Patent Document 2] JP 2002-288993

As described above, a semiconductor memory, such as a flash memory, is equipped with a redundancy function for compensating for defective memory elements therein. FIG. 10 is a block diagram of an example of using a redundant bit RB to replace a defective bit FB during a page read-out operation of a flash memory. A page of data read out from a memory array is stored in a page buffer 410 of the flash memory 400. The page of data comprises data read out from a main memory region MM and a redundant memory region MR. A column control circuit 420 comprises a data register storing data which is transmitted in parallel from the page buffer. For example, data stored in the data register is continuously and successively read out in series as an address value of a counter is increased, and the read-out data is transmitted to an input/output buffer 430. When there is a defective hit FB at a column address AddF of the main memory region MM, if the address value of the counter is consistent with the defective bit (that is, the column address AddF), the column control circuit changes the address value into an address of a redundant bit RB of the redundant memory region MR by an address pointer so as to replace the defective bit FB with the redundant bit RB.

The defective bit FB is a physical defect, such as an electrical short-circuit or open-circuit, inherent with the qualified memory device following manufacturing thereof. Redundancy information, such as the column address of the defective bit and the column of the redundant bit used to replace the defective bit, is stored in a read only memory or any other non-volatile memory. Then, as described above, when reading out a page, if the current address is consistent with the address of the defective bit, the access to the defective bit is forbidden, and a pointer movement control is performed at the address of the redundant bit. Moreover, a similar method is performed when writing-in data; that is, the access to the defective bit FB is transferred to the access to the redundant bit RB.

However, the address pointer movement control for replacing the defective bit FB with the redundant bit RB takes a certain amount of time, and thus, hinders high-speed reading-out or writing-in. Furthermore, the size of a non-volatile memory chip, such as a flash memory, is developed based on the design of the basic core (memory cell array). Accordingly, the area occupied by the peripheral circuit (decoder or control circuit) surrounding the basic core is larger than that of the basic core and the redundancy function performed to the memory chip requires an enlarged area of the peripheral circuit. In view of the above, there are difficulties in downsizing the memory chip.

BRIEF SUMMARY OF THE INVENTION

The purpose of the invention is to provide a memory device comprised to have a redundancy function which is able to be performed during high-speed reading-out or writing-in of data.

Moreover, the purpose of the invention is to further provide a memory device having a reduced peripheral circuit area and increased memory capacity of a memory cell array thereof.

An embodiment of the invention provides a memory device, comprising: at least one memory; a controller, controlling the at least one memory; and a connect unit, connecting to the at least one memory and the controller, wherein the at least one memory comprises: a memory region, comprising a plurality of memory cells; a redundant memory region, comprising a plurality of memory cells; and a redundancy information memory unit, storing redundancy information of the memory cells of the memory region, wherein the controller comprises: a control unit, controlling data read-out from the at least one memory and data to be written-in to the at least one memory according to the redundancy information stored in the redundancy information memory unit.

The control unit further comprises: a request unit, requesting the at least one memory to transmit the redundancy information; a redundancy information storage unit, storing the transmitted redundancy information; and a column control unit, performing column control on the data read-out from the at least on memory and the data to be written-in to the at least one memory according to the stored redundancy information. The redundancy information comprises column address information of memory cells having physical defects in the memory region. The at least one memory comprises: an output unit, outputting data read-out from the memory region and the redundant memory region continuously, wherein the control unit of the controller replaces data read-out from the defective memory cells of the memory region with data read-out from memory cells in the redundant memory according to the redundancy information. The output unit further comprises a data storage unit, storing data read-out through each bit lines of the memory region and the redundant memory region, wherein the output unit continuously and serially outputs data stored in the data storage unit. The at least one memory further comprises an input unit, receiving data to be written-in to the memory region and the redundant memory region, wherein the control unit of the controller replaces data to be written-in to defective memory cells of the memory region with data to be written-in to memory cells in the redundant memory according to the redundancy information. The input unit further comprises a data storage unit, storing data to be written-in through each bit lines of the memory region and the redundant memory region, wherein write-in data from the controller is continuously and serially input to the data storage unit, and the input write-in data is transmitted to the data storage unit.

When power is input to the controller, the request unit sends out a command for requesting the at least one memory to transmit the redundancy information. It is preferred that the redundancy information storage unit is anon-volatile memory. The at least one memory is a flash memory chip formed by a plurality of NAND strings on a silicon board, the controller is a controller chip formed on another silicon board, and the flash memory chip and the controller chip are modularized. The flash memory chip and the controller chip are comprised in one package.

Another embodiment of the invention provides a redundancy method for defective memory cells of a memory region of a flash memory, comprising: transmitting redundancy information related to the defective memory cells to a controller when power is input to the controller, wherein the redundancy information is stored in the flash memory; and when performing the data write-in and data read-out on the flash memory, controlling read-out data and data to be written-in according to the redundancy information by the controller.

The controller replaces data of the defective memory cells with data of redundant memory cells according to the redundancy information. Page data read-out from a page of the flash memory comprises data of memory cells of a memory region and data of memory cells of a redundant memory region, and the page data is continuously read-out from a data register and provided to the controller. When performing the write-in operation of the flash memory, the controller forms page data according to the redundancy information and transmits the formed page data to the flash memory, wherein the flash memory continuously inputs the page data to a data register and provides the input page data to memory cells of a memory region and memory cells of a redundant memory region through each bit line.

According to the invention, the redundancy information stored by the memory is transmitted to the controller, and reading-out and writing-in of data of the memory can be performed at more high speeds than that of prior arts. Furthermore, since the column control of the redundancy function for compensating for the detective memory cells is performed at the controller side, the structure of the peripheral circuit of the memory is simplified, and thus, the area of the peripheral circuit can be reduced. Accordingly, a highly-integrated memory chip can be downsized.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of the invention are described below with references made to the accompanying drawings. Here, an example of a NAND-type flash memory is used as a preferred embodiment. In addition, to be noted, for simplicity and clarity, the elements in the Figures may be enlarged and have different proportions from that in the practical situation.

FIG. 1 is a block diagram of a memory device according to an embodiment of the invention. A memory device 20 is connected to a main device 10. The memory device 20 responds to requests of the main device 10. The memory device 20 comprises a controller 30 and a flash memory 40. The controller 30 responds to commands conveyed by the main device 10 and controls operations of the flash memory 40. For example, when the controller 30 receives a write-in command and write-in data from the main device 10, the controller 30 transmits the write-in command and the write-in data to the flash memory 40 and the flash memory 40 performs writing-in of data according to the information. Moreover, when the controller 30 receives a read-out command from the main device 10, the controller 30 transmits the read-out command and address data to the flash memory 40 and the flash memory 40 performs reading-out of data according to the information and transmits the read-out data to the controller 30. Then the controller 30 transmits the read-out data to the main device 10. Accordingly, the controller 30 can be an interface between the main device 10 and the flash memory 40.

Figure 1A:
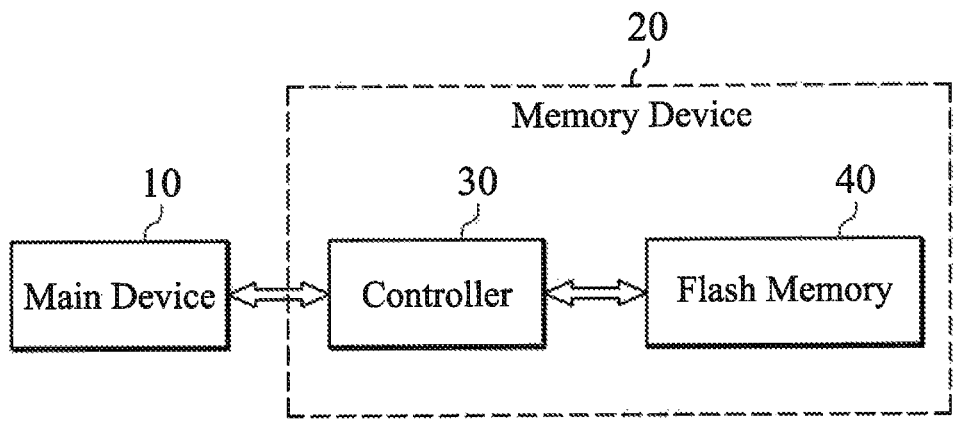
FIG. 1A and FIG. 1B are block diagrams of a memory device according to an embodiment of the invention.
Figure 1B:
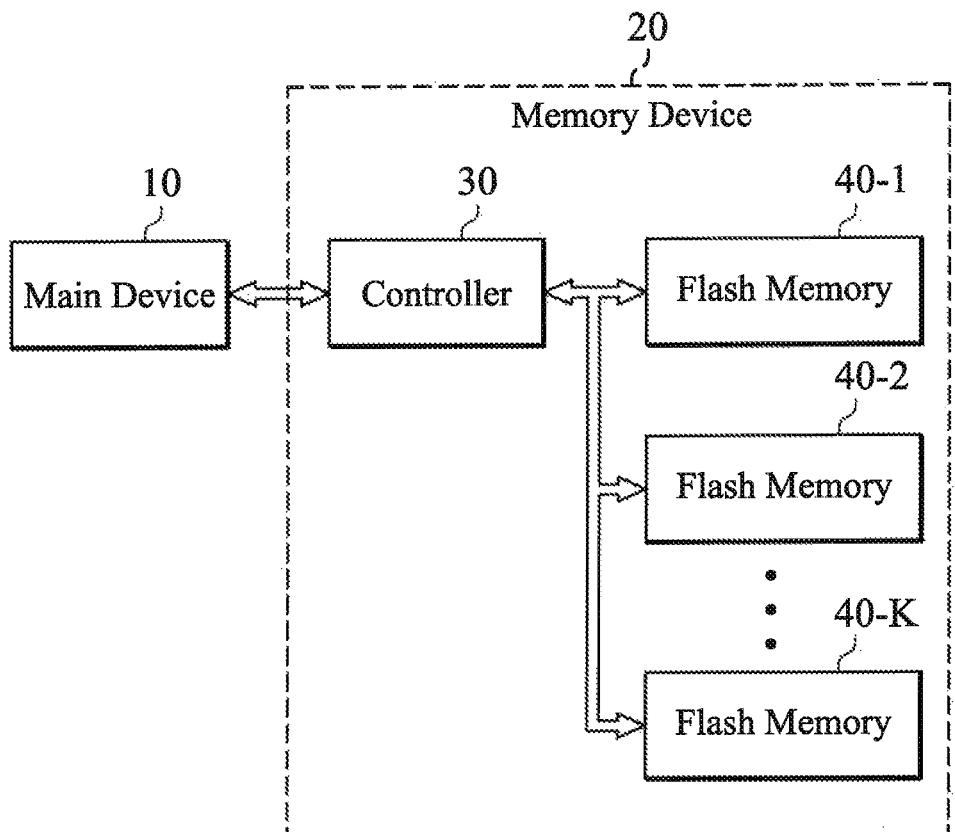

The memory device 20 can be a memory device having a single flash memory 40, as shown in FIG. 1A, or a memory device having a plurality of flash memories 40-1, 40-2, ..., 40-K, as shown in FIG. 1B. As shown in FIG. 1B, each flash memory is the same, and the controller 30 can select any flash memory from the plurality of flash memories and perform reading/writing of data on the selected flash memory. Alternatively, the controller can select multiple flash memories at the same time and perform reading/writing of data simultaneously on the selected flash memories in parallel. Furthermore, in the flash memory, a memory element can be an SLC-type NAND storing a bit or an MLC-type NAND storing multiple bits.

Figure 2A:
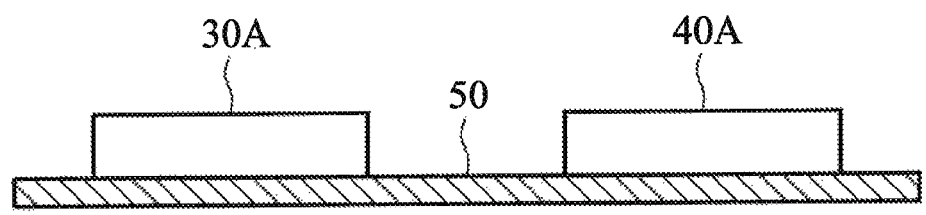
FIG. 2A and FIG. 2B are block diagrams of examples of a physical structure of the memory device.
Figure 2B:
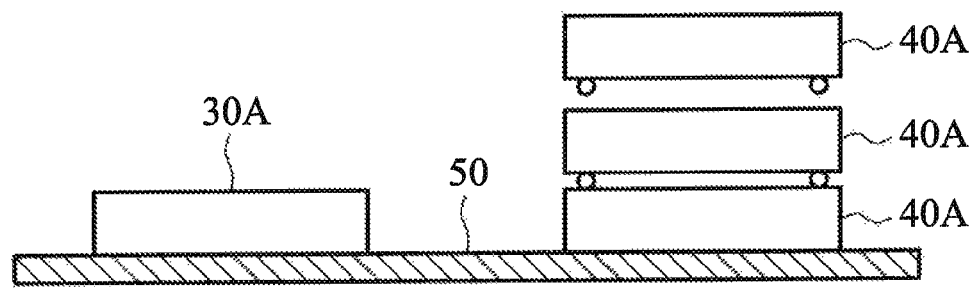

FIG. 2 is a block diagram of a physical structure of the memory device 20. As shown in FIG. 2A, a bare chip 30A comprising the controller 30 and a bare chip 40A comprising the flash memory 40 are comprised on a printed circuit board or a flexible circuit board 50. The bare chip 30A and the bare chip 40A are electrically connected to each other by conductive wires on the board 50. In addition, as shown in FIG. 2B, a plurality of bare chips 40A, each of which comprises a respective one of the plurality of flash memories 40-1, 40-2 ..., 40-K, can be stacked up together. The structure is only an example. Regarding the physical structure of the memory device, each chip can be a module unit in any form. Moreover, the chip comprising the main device 10 can be comprised on the same circuit board.

Figure 3:
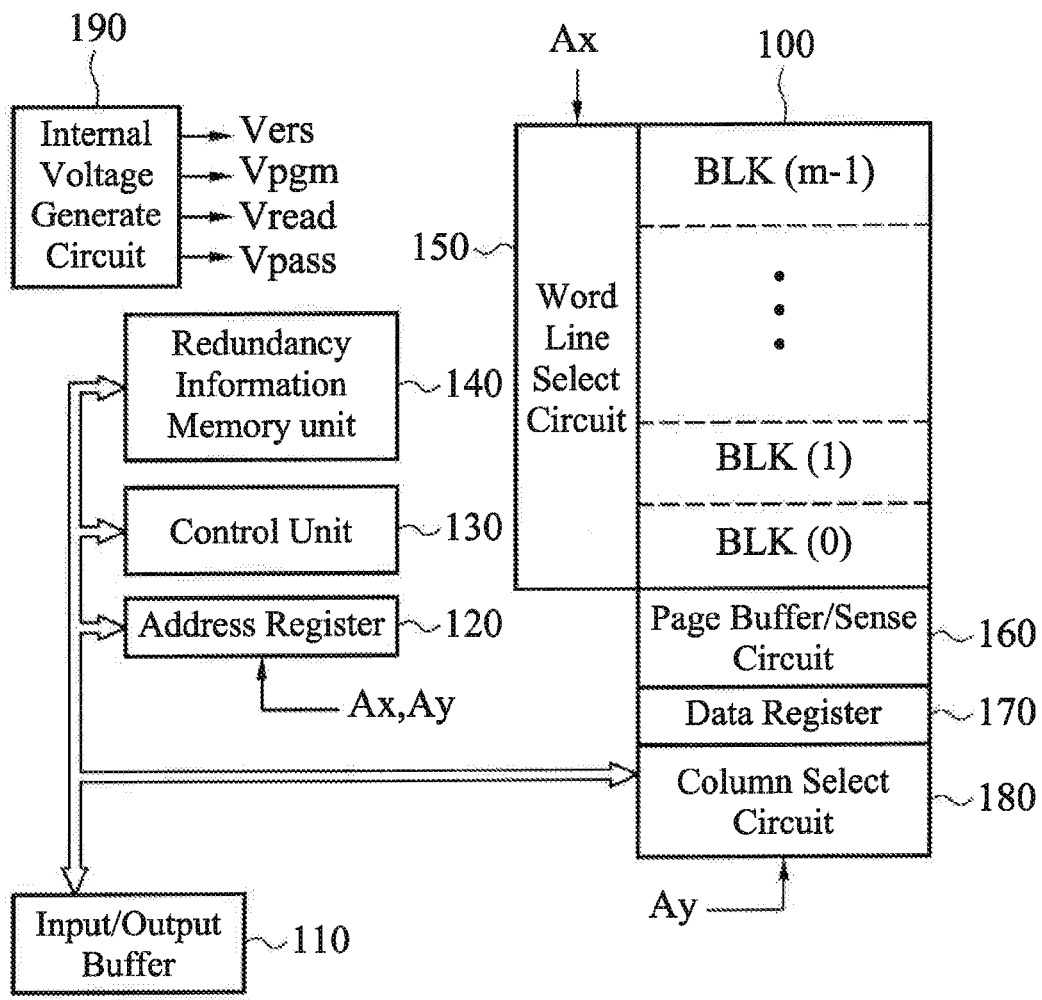
FIG. 3 is a block diagram of a typical internal structure of a flash memory.

Next, FIG. 3 is a block diagram of a typical internal structure of a flash memory. To be noted, the flash memory shown in FIG. 3 is only exemplary, and the invention is not limited thereto. Furthermore, in the following description, a memory cell (memory element) having physical defects is called a "defective cell", a row (column) address of the defective cell is called a "defective address", a memory cell (memory element) of the redundant memory region is called a "redundant cell", and a row (column) address of the redundant cell is called a "redundant address".

The flash memory according to the embodiment comprises a memory array 100, an input/output buffer 110, an address register 120, a control unit 130, a redundancy information memory unit 140, a word line select circuit 150, a page buffer/sense circuit 160, a data register 170, a column select circuit 180 and an internal voltage generate circuit 190. The memory array 100 comprises a plurality of memory cells arranged in columns and rows. The input/output buffer 110 is connected to an external input/output terminal and stores input/output data. The address register 120 receives address data from the input/output buffer 110. The controller 130 receives commands or external control signals from the input/output buffer 110 and controls components. The redundancy information memory unit 140 stores redundancy information related to memory cells of the memory array 100. The word line select circuit 150 receives row address information Ax, decodes the row address information Ax and performs selection of a region and a word line according to the decoding result. The page buffer/sense circuit 160 stores data read-out from a page selected by the word line select circuit 150 or data to be written-in to the selected page. The data register 170 is connected to the page buffer/sense circuit 160 and stores data input/output via the input/output buffer 110. The column select circuit 180 receives column address information Ay from the address register 120, decodes the column address information Ay and selects data in the data register 170 according to the decoding result. The internal voltage generate circuit 190 generates voltages for reading-out data, writing-in data and erasing data (write-in voltage Vpgm, pass voltage Vpass, read-out pass voltage Vread, erase voltage Vers, and so on).

Figure 4:
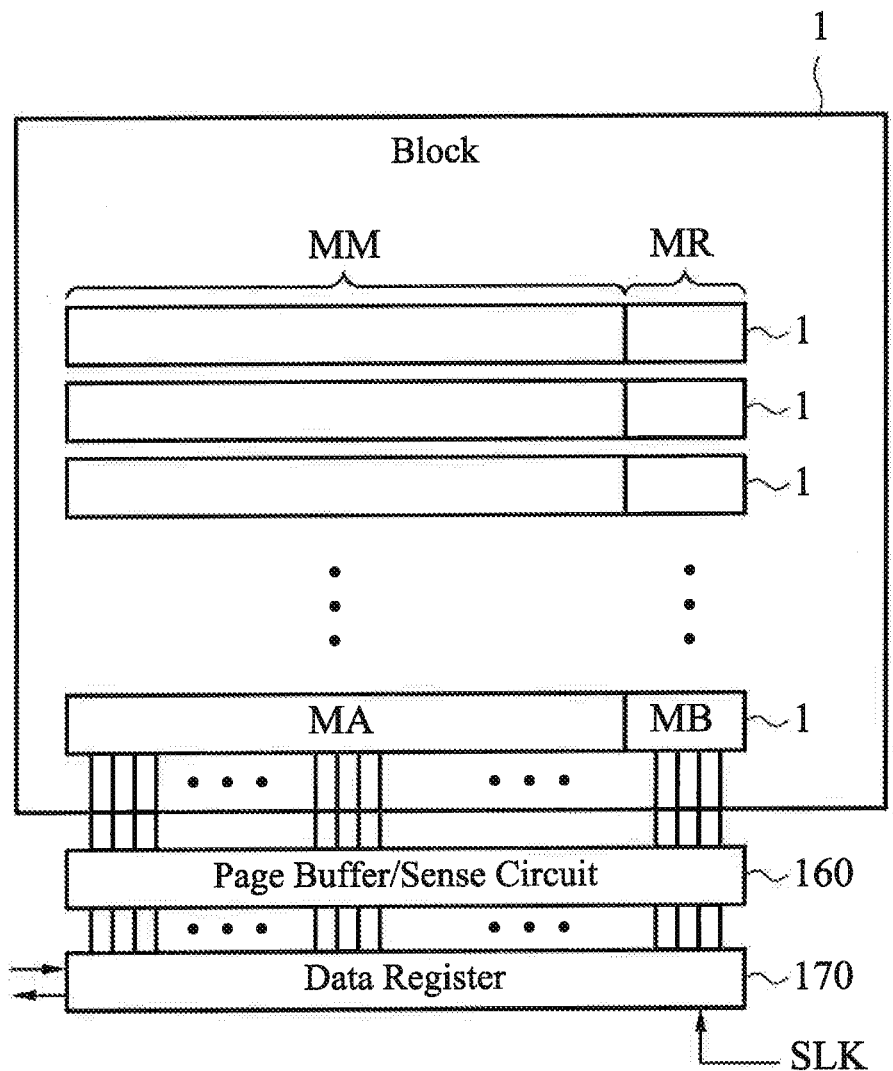
FIG. 4 is a block diagram of a cell array in one memory block.

The memory array 100 comprises m memory blocks BLK (0), BLK(1) ... BLK(m−1) arranged along the column direction. FIG. 4 is a block diagram of a cell array in one memory block. For a flash memory, a memory block is a basic unit for erasing data. The memory block comprises a plurality of pages. A page is a basic unit for reading-out or writing-in data. One page comprises a plurality of memory cells arranged in the same row in NAND strings. Moreover, the memory block is divided into a memory region MM for normal data reading/writing and a redundant memory region MR based on functions. Here, one page comprises data read-out from or data to be written into the memory cells of the memory region MM and the redundant memory region MR. However, when reading-out or writing-in data based on the page unit, it is not limited to one page. Reading-out or writing-in can be performed on a plurality pages at the same time.

The page buffer/sense circuit 160 is connected to all bit lines in each block. The page buffer/sense circuit 160 uses the sense circuit to sense data read-out from the selected page in the selected block and stores the data in the page buffer 160. The page buffer 160 is connected to the data register 170 through a transfer gate (not shown), and the data stored in the page buffer 160 is transmitted to the data register 170 through the transfer gate. When the transmission of data from the page buffer 160 to the data register 170 is finished, the page buffer 160 stores page data which is read-out next. Meanwhile, data stored in the data register 170 is continuously output to the input/output buffer 110 in sequence.

During the writing-in (programming) operation, data output from the input/output buffer 110 is continuously input to the data register 170 in sequence and stored in the data register 170. When write-in data stored in the page buffer 160 is written-in to the selected page, data stored in the data register 170 is transmitted to the page buffer through the transfer gate. In a preferred embodiment, serial data input/output of the data register 170 is performed synchronously by a serial clock signal SLK.

Figures 5, 5A:
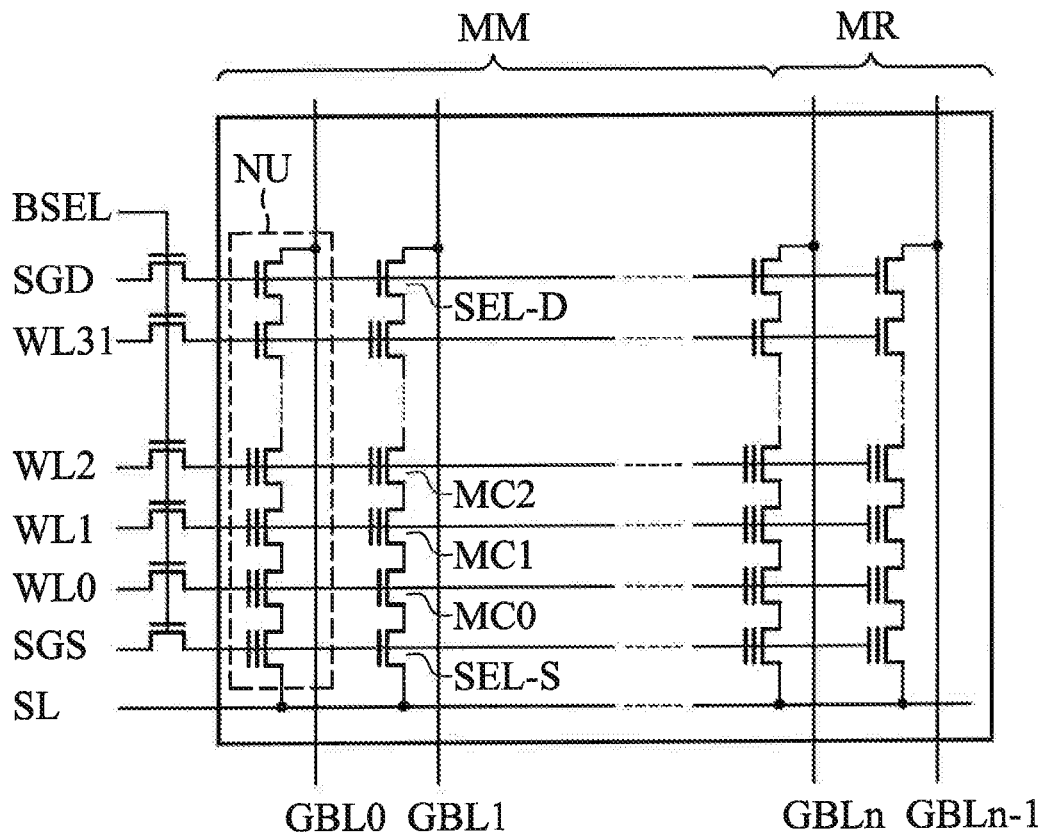
FIG. 5 is a block diagram of a structure of a NAND string unit.
FIG. 5A is a block diagram of an example of redundancy information stored in a redundancy information memory unit.

FIG. 5 is a block diagram of NAND strings in one memory block. A memory block comprises a plurality of NAND strings. A NAND string (called a cell unit NU in the following) is constructed by a plurality of memory cells (memory elements) connected in serial. Each cell unit NU is arranged along the column direction. A plurality of cell units NU arranged along the row direction, forming one memory block, is comprised in a well, such as a P-well. As shown in the figure, the memory block comprises n bits (number) of cell units NU, wherein a predetermined number of bits is used for the memory region MM fir general data reading/writing, and the rest of the bits is used for the redundant memory region MR.

A cell unit NU comprises N memory cells MCi (i=0, 1 ..., N−1) connected in serial and a source select transistor SEL-S and a drain select transistor SEL-D connected to two terminals of the N memory cells in serial, respectively. In this example, the cell unit NU comprises 32 memory cells.

A gate of each memory cell MCi is connected to a corresponding one of word lines WL0~WL31. All source select transistors SEL-S are connected to each other through a source select line SGS. All drain select transistors SEL-D are connected together through a drain select line SGD. A drain of the source select transistor SEL-S is connected to a source of the memory cell MC0. A source of the source select transistor SEL-S is connected to a common source line SL. A gate of the source select transistor SEL-S is connected to the source select line SGS. A source of the drain select transistor SEL-D is connected to a drain of the memory cell MC31. A drain of the drain select transistor SEL-D is connected to a corresponding global bit line GBL. A gate of the drain select transistor SEL-D is connected to the drain select line SGD. The word lines WL0~WL31, the source select line SGS and the drain select line SGD are connected to the word line select circuit 150 through block select transistors, and gates of the block select transistors are commonly connected to a block select line BSEL. When the word line select circuit 150 selects the block, the block select transistors are turned on through the block select line BSEL. Moreover, the word line select circuit 150 selects the block through the block select line BSEL according to the row address Ax and uses a predetermined voltage corresponding to the operation status to drive the source select line SGS and the drain select line SGD in the selected block.

The memory cells MCi in the block, the source select transistor SEL-S and the drain select transistor SEL-D are NMOS transistors formed in a P-type well. The memory cell comprises a source and a drain of N-type diffusion area, a tunnel oxide film formed on a channel between the source and the drain, a floating gate (charge accumulation layer) formed on the tunnel oxide film for accumulating charges and a control gate formed by a dielectric layer on the floating gate. Generally speaking, when the floating gate doesn't accumulate charges, if data "1" is written-in, the threshold value is a negative value, and the memory cell is normally turned on. When the floating gate accumulates charges, if data "0" is written-in, the threshold value is shifted toward a positive value, and the memory cell is normally turned off.

In a preferred embodiment, global bit lines GBL0, GBL1 . . . , GBLn–1 connected to the cell unit NU are connected to the page buffer/sense circuit 160 through a bit line select circuit. When writing-in and reading-out data, the bit line select circuit selects even-numbered bit lines or odd-numbered bit lines and connects the selected even-numbered bit lines or odd-numbered bit lines to the page buffer/sense circuit 160. If one sense circuit 160 is shared by a pair of an even-numbered bit line and an odd-numbered bit line and each of the pair constitutes one page, the page buffer/sense circuit 160 comprises a sense circuit for one page of data. When reading-out data, the sense circuit 160 senses a voltage level of the even-numbered bit line or the odd-numbered bit line. When writing-in data, the write-in data is stored in the even-numbered bit line or the odd-numbered bit line. The column select circuit 180 selects a bit line according to the column address Ay. The write-in data is written-in to the selected bit line, or data is read-out from the selected bit line.

The memory cell array comprises defective cells having physical defects (short-circuit, open-circuit, and so on) caused during the manufacturing process. Redundant cells of the redundant memory region can be used to compensate for the defective cells. The defective cells can be detected by tests before shipment, and redundancy information related to the defective cells and the redundant cells used to compensate for the defective cells is stored in the redundancy information memory unit 140. The redundancy information memory unit 140 is constituted by a non-volatile memory, such as a fuse read only memory. For example, the redundancy information memory unit 140 stores defective addresses of the defective cells and redundant addresses of the redundant cells used to compensate for the defective cells. The defective addresses and the redundant addresses comprise address of blocks that include the defective cells and the redundant cells and column addresses of the defective cells and the redundant cells, and row addresses of the defective cells and the redundant cells if necessary. Also, the redundancy information memory unit 140 may also store error repair information of memory cells. FIG. 5A is an example of the redundancy information of the redundancy information memory unit 140.

Figure 6:
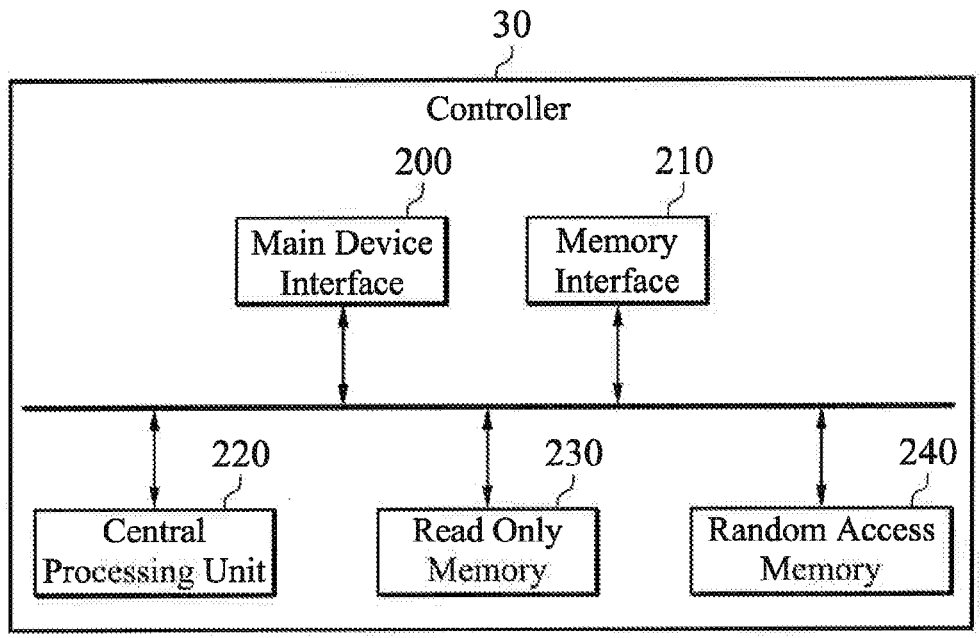
FIG. 6 is a block diagram of a controller.

FIG. 6 is a block diagram of the controller 30. The controller 30 comprises: a main device interface 200 for receiving/transmitting data between the controller 30 and the main device 10 in FIG. 1; a memory interface for receiving/transmitting data between the controller 30 and the flash memory 40; a central processing unit 220; a read only memory (ROM) 230 for storing programs; and a random access memory (RAM) 240 for storing data read-out from the flash memory and write-in data received from the main device. The central processing unit 220 performs the programs stored in the ROM 230 so as to control all components.

Figure 7:
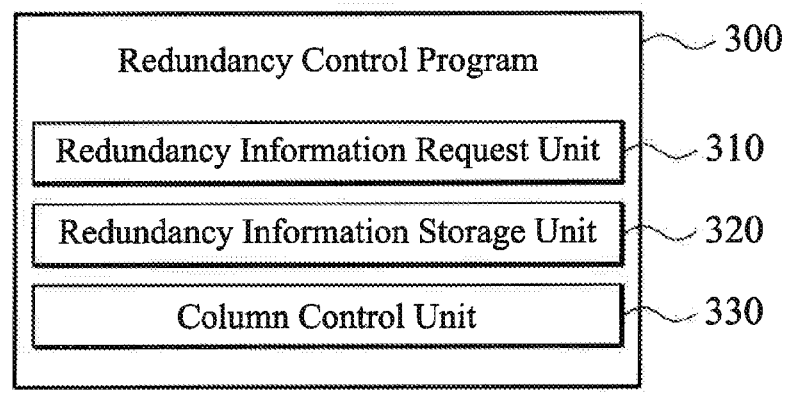
FIG. 7 is a block diagram of a redundancy control program of the controller.

To be noted, the controller 30 includes a part of the redundancy function of the flash memory 40. In view of this, the ROM 230 stores a redundancy control program 300 as shown in FIG. 7. The redundancy control program 300 comprises: a redundancy information request unit 310, requesting the flash memory 40 to transmit the redundancy information; a redundancy information storage unit 320, storing the received redundancy information; and a column control unit 330, controlling the read-out data or the write-in data of the flash memory according to the redundancy information. Though the redundancy information request unit 310 can request for the redundancy information at any moment, in a preferred embodiment, the redundancy information request unit 310 performs requests when the power is input to the controller 30.

Figure 8:
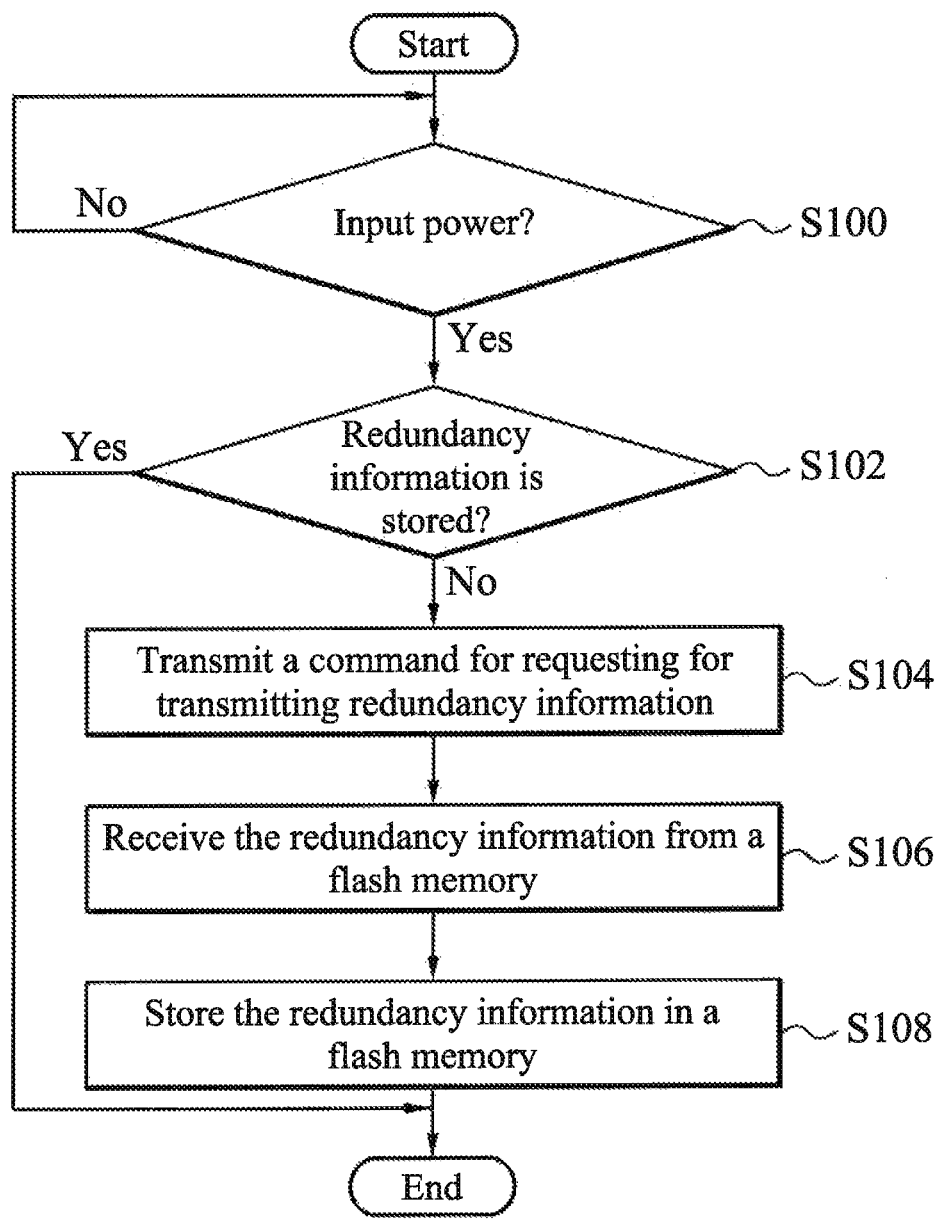
FIG. 8 is a flow chart of an operation for requiring redundancy information of a memory device according to an embodiment of the invention.

FIG. 8 is a flow chart of an operation of the redundancy information request unit 310. The redundancy information request unit 310 checks whether the power is input to the controller 30 (step S100) and checks whether the redundancy information storage unit 320 stores the redundancy information (steps S102). If the redundancy information is stored, the operation ends. If the redundancy information is not stored, the redundancy information request unit 310 transmits a command for requesting the flash memory to transmit the redundancy information through the memory interface 210 (step S104). The control unit 130 of the flash memory 40 interprets the command and transmits the redundancy information stored in the redundancy memory unit 140 to the controller 30. The redundancy information request unit 310 receives the redundancy information from the flash memory (step S106) and store the redundancy information in the redundancy information storage unit 320 (step S108). Moreover, when the redundancy information storage unit 320 is a non-volatile memory, obtaining redundancy information obtained from the flash memory is performed only once when the power is input. In this case, the steps as shown in FIG. 8 do not have to be repeated every time when the power is input.

A page read-out operation of the memory device according to the embodiment is explained in the following. As shown in the flow chart of FIG. 9, in order to respond to a request of the main device 10, the controller 30 transmits a page read-out command and address information to the flash memory (step S200). The flash memory 40 selects a memory block and a page (row) according to the address information and reads out data of the selected page to the page buffer 160. As described above, one page comprises data read out from memory cells of the memory region MM and the redundant memory region MR. The data register 170 receives page data transmitted from the page buffer 160 and outputs the page data continuously (step S202).

The controller 30 inputs the page data through the memory interface 210 and stores the page data in the data register (step S204). Then, the column control unit 330 compares an address of the page data stored in the data register with the defective address in the redundancy information and determines whether the address is consistent with the defective address (step S206). If the address is consistent with the defective address, data in the defective cell corresponding to the defective address is replaced by data in the redundant cell corresponding to the redundant address in the same page data (step S208). Then, the controller 30 sets data of the stored page data except the data of the redundant memory region to be page data which should be transmitted to the main device 10.

Figure 9:
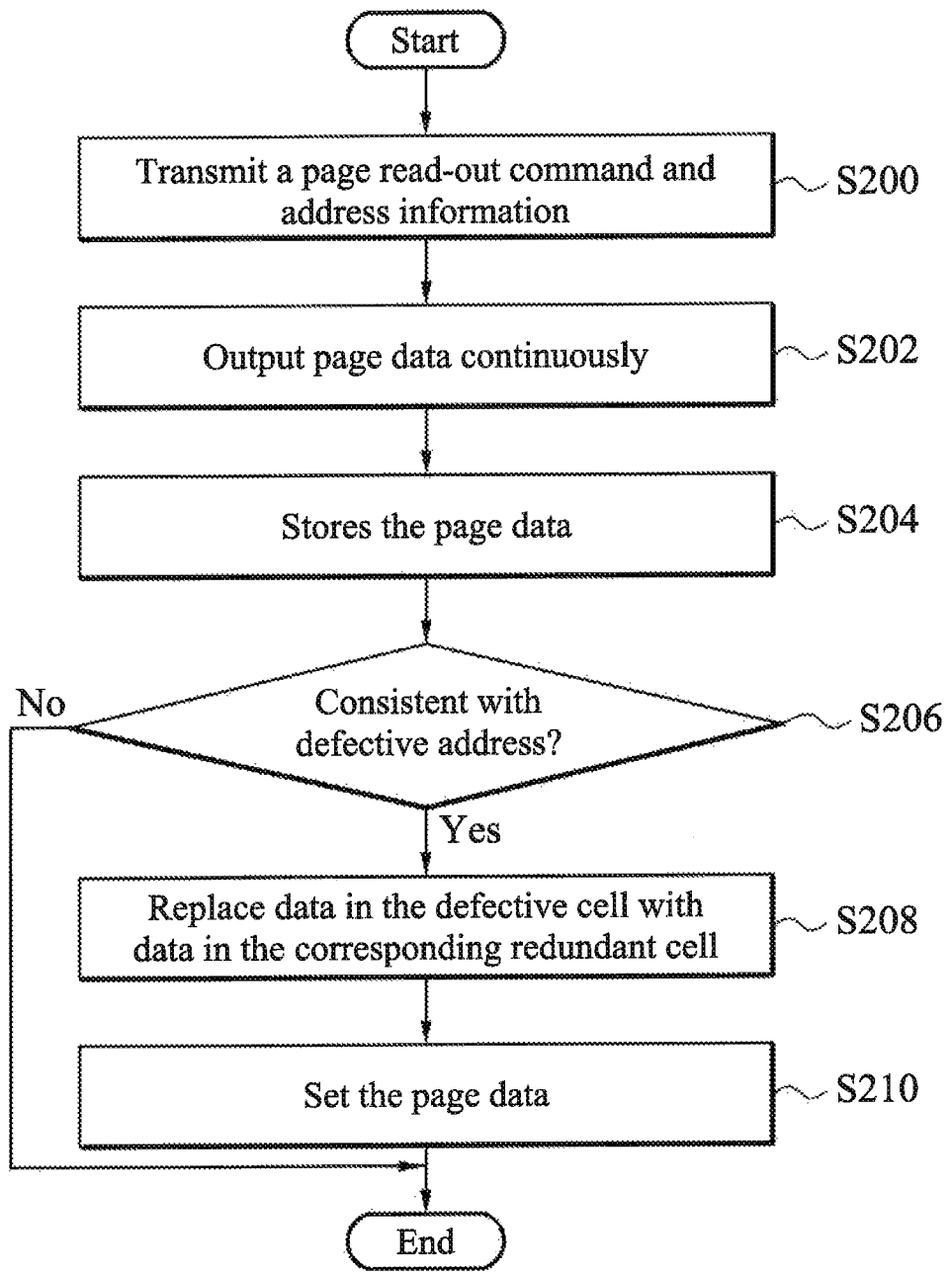
FIG. 9 is a flow chart of a page read-out operation of a memory device according to an embodiment of the invention.
Figure 9A:
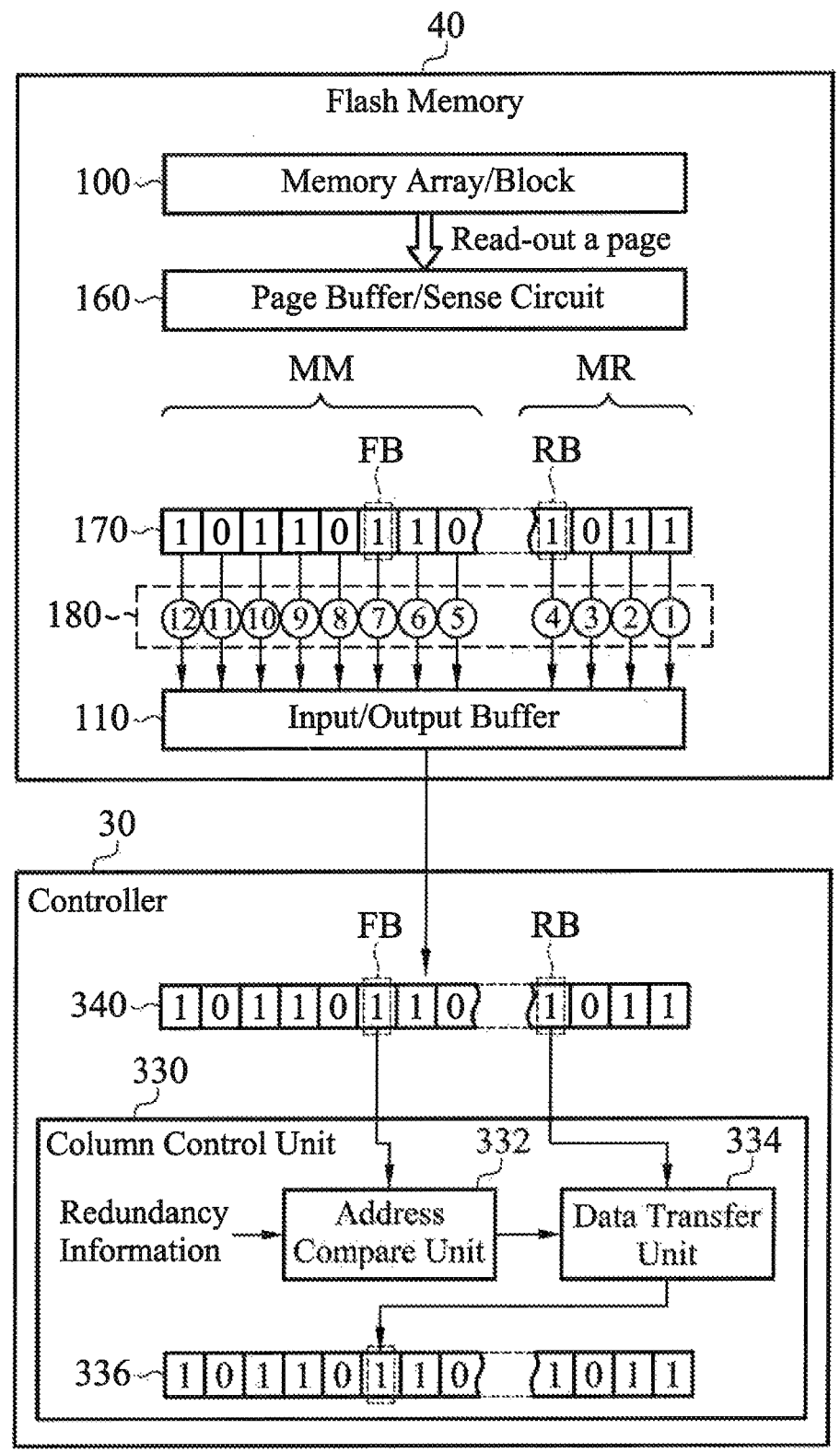
FIG. 9A is a block diagram of a page readout operation according to an embodiment of the invention.

FIG. 9A is a block diagram of the page read-out operation described above. The memory 40 performs reading-out on the selected page of the selected block according to the command form the controller. The page data is transmitted to the data register 170 through the page buffer/sense circuit 160. The data register stores page data of the memory region MM and the redundant memory region MR. When the memory region MM includes a defective cell, a defective bit FB corresponding to the defective cell is stored in the data register 170. Moreover, a redundant bit RB corresponding to a redundant cell used to compensate for the defective cell is also stored in the data register 170. Then, the column select circuit 180 continuously outputs the page data stored in the data register 170 to the input/output buffer 110 in sequence. Numbers shown in the Figure represent the order of data when read out from the data register 170. Furthermore, data of the redundant memory region MR is read out in sequence first, and then data of the memory region MM is read out in sequence.

The page data read out from the flash memory 40 is input to the data register 340 in sequence through the input/output buffer of the controller 30. Therefore, the data register 340 stores the page data according to the same address order as the data register 170 of the flash memory. That is, the defective bit FB and the redundant bit RB are stored in the same positions as in the data register 170.

Next, the column control circuit 330 compares the defective address stored in the redundancy information storage unit 320 and the column address of the defective bit FB of the data register 340. If the two addresses match, a data transfer unit 334 replaces the data of the defective bit FB with the data of the redundant bit RB and sets page data in a page buffer 336 accordingly. The page data in the page buffer 336 is transmitted to the main device 20. In this case, data of the redundant memory region MR is removed from the transmitted page data.

Moreover, when the page read-out command is transmitted, the column 330 may determine whether the selected memory block comprises any defective cells according to the redundancy information. When it is determined that the selected memory block doesn't comprise any defective cells, the determining result is sent to the column control unit 330, and thus the column control unit 330 can ignore the redundancy operation as shown in FIG. 9.

Figure 9B:
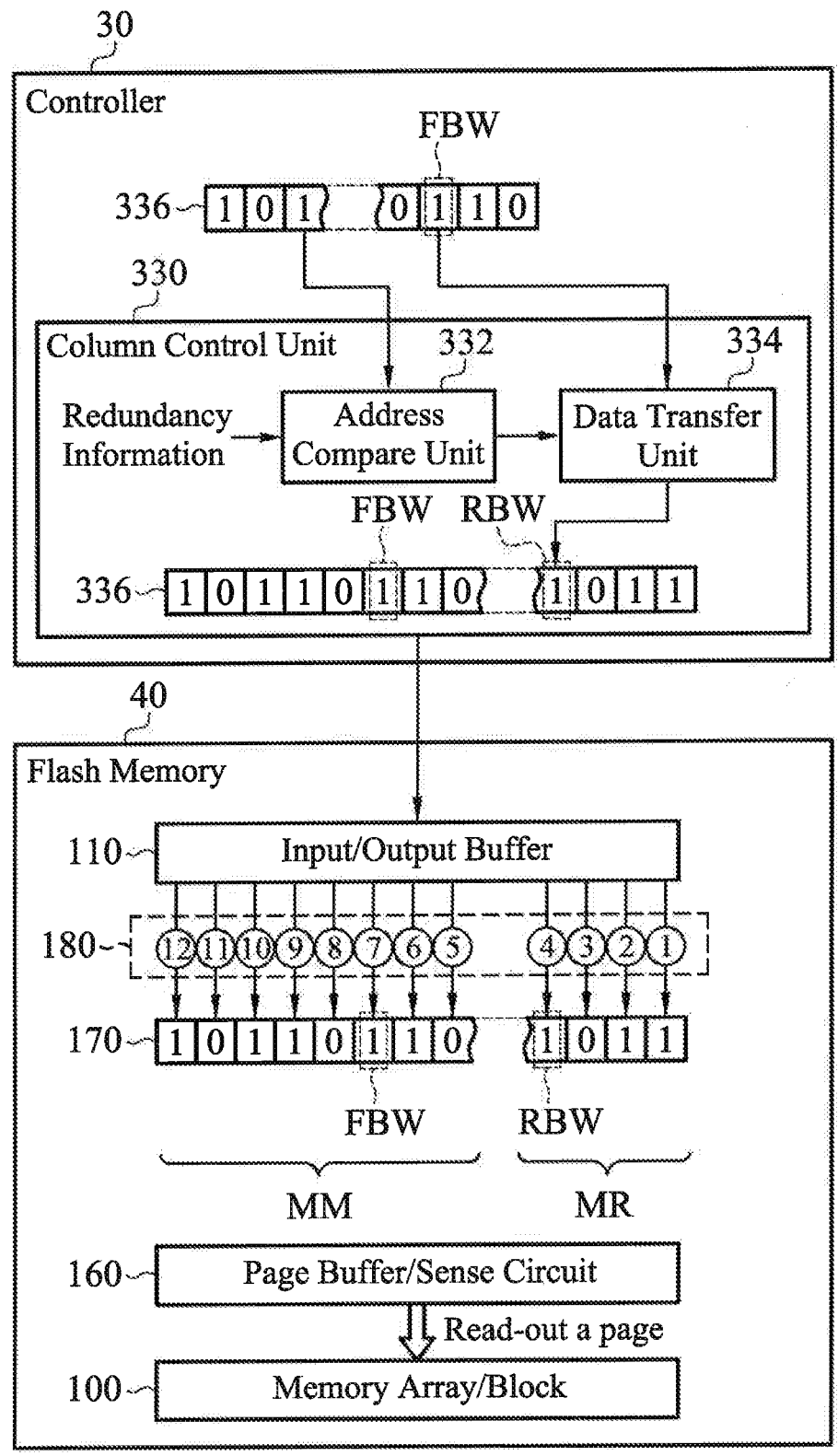
FIG. 9B is a block diagram of a page write-in operation according to an embodiment of the invention.
Figure 10:
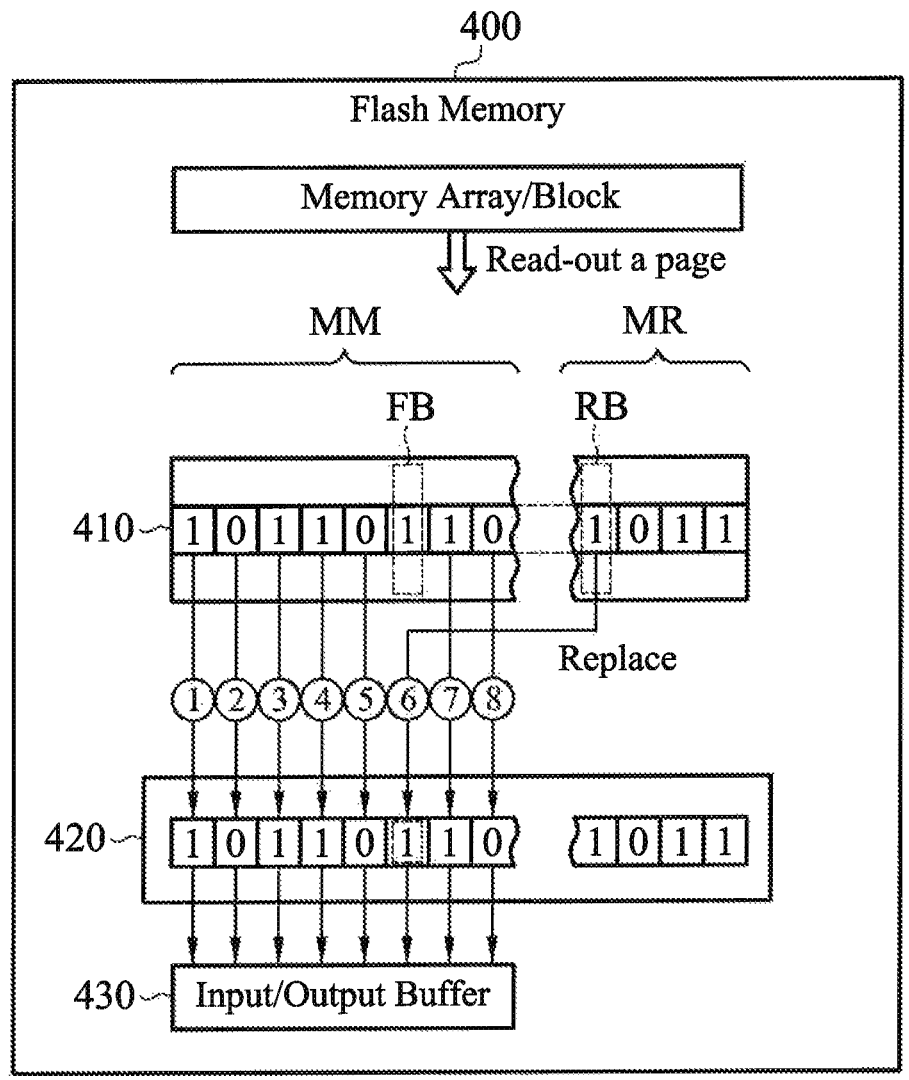
FIG. 10 is a block diagram of a redundancy function of a flash memory in prior arts.

Next, FIG. 9B is used to explain a write-in operation of the memory device according to the embodiment. The main device 10 transmits a write-in request and write-in data to the controller 30. The write-in data is stored in the page buffer 336 through the input/output buffer. At this moment, the page buffer 336 doesn't store write-in data to be written to the redundant memory region. Then, the column 330 determines whether a memory block where data is to be written-in comprises any defective cells according to the redundancy information (FIG. 5A). If the memory block comprises a defective cell, since the write-in data cannot be written-in directly, an address compare unit 332 searches data FBW in the page buffer 336 that has an address consistent with the defective address of the defective cell, and the data transfer unit 334 uses data RBW of the redundant memory region to overwrite the data FBW. Alternatively, the data transfer unit 334 copies the data RBW of the redundant memory region to the data FBW. Then, the data transfer unit 334 attaches redundant bits consistent with the number of bits of the redundant memory region MR into the page buffer 336 so as to generate a page of write-in data. The controller 30 transmits the write-in command, the address and the write-in data stored in the page buffer 336 to the flash memory 40.

The write-in data is continuously input to the data register 170 in sequence through the input/output buffer 110, and thus the data register 170 stores a page of write-in data. Then, the data stored in the data register 170 is transmitted to the page buffer 160. The data FBW is written-in to a cell unit having the defective cell and the redundant data RBW is written-in to a cell unit of the redundant memory region MR.

According to the embodiment, unlike prior arts, data does not have to be read out by moving the address pointer when transmitting input/output buffer data. Therefore, data input/output operations of the flash memory can be performed at high speeds. In addition, regarding the manufacturing process of the controller, in order to reduce the area of the peripheral circuit in the memory chip, the column control is shifted to the controller side, and thus, processing speed is increased. Since the column control is shifted to the controller side, the structure of the column control circuit of the flash memory is simpler, and therefore, space of the peripheral circuit is retrenched.

Examples of page read-out and page write-in are illustrated in the above embodiments. However, the invention can also be applied to read-out operations and write-in operations other than above ones. For example, when read-out and write-in of a certain range of data is performed by a controller according to a specified column address, the redundancy scheme can also be used. In addition, in the above embodiments, the column control unit 330 in the controller 30 performs data processing mainly by software. However, the column control unit 330 can also perform data processing by hardware. Furthermore, in the above embodiments, the memory blocks arranged in one column in FIG. 3 is only exemplary, and the invention is not limited thereto. For example, memory blocks may be arranged at two side of the word line select circuit 150 and one word line can select two pages. Moreover, structures of the page buffer and the data register can be modified appropriately according to the structure of the array and the pipeline processing of data input/output. Also, in the above embodiments, the flash memory is only exemplary, and the invention is not limited thereto. For example, the redundancy scheme of the invention can also be applied to a non-volatile memory other than the flash memory and a volatile memory.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
   at least one memory;
   a controller, controlling the at least one memory, and the controller comprising:
      a control unit, controlling data read-out from the at least one memory and data to be written-in to the at least one memory according to a redundancy information;
      a request unit, requesting the at least one memory to transmit the redundancy information from the at least one memory;
      a redundancy information storage unit, storing the redundancy information; and
      a column control unit, performing column control on the data read-out from the at least on memory and the data to be written-in to the at least one memory according to the stored redundancy information; and
   a connect unit, connecting to the at least one memory and the controller,
   wherein the at least one memory comprises:
      a memory region, comprising a plurality of memory cells;
      a redundant memory region, comprising a plurality of memory cells;
      a redundancy information memory unit, storing redundancy information of the memory cells of the memory region, wherein the redundancy information comprises column address information of memory cells having physical defects in the memory region, and redundant addresses of the memory cells of the redundant memory region used to compensate for the memory cells having physical defects in the memory region; and
      an input unit, receiving data to be written-in to the memory region and the redundant memory region, wherein the input unit comprises a data storage unit storing data to be written-in through each bit lines of the memory region and the redundant memory region,
      wherein write-in data from the controller is input to the data storage unit, and the write-in data is transmitted to the data storage unit, and
      wherein a control unit of the controller replaces data to be written-in to defective memory cells of the memory region with data to be written-in to memory cells in the redundant memory according to the redundancy information.

2. The memory device as claimed in claim 1, wherein the at least one memory comprises:
   an output unit, outputting data read-out from the memory region and the redundant memory region,
   wherein the control unit of the controller replaces data read-out from defective memory cells of the memory region with data read-out from memory cells in the redundant memory according to the redundancy information.

3. The memory device as claimed in claim 2, wherein the output unit comprises:
   a data storage unit, storing data read-out through each bit lines of the memory region and the redundant memory region,
   wherein the output unit outputs data stored in the data storage unit.

4. The memory device as claimed in claim 1, wherein when power is input to the controller, the request unit sends out a command for requesting the at least one memory to transmit the redundancy information.

5. The memory device as claimed in claim 1, wherein the redundancy information storage unit is a non-volatile memory.

6. The memory device as claimed in claim 1, wherein the at least one memory is a flash memory chip formed by a plurality of NAND strings on a silicon board, the controller is a controller chip formed on another silicon board, and the flash memory chip and the controller chip are two separate chips.

7. The memory device as claimed in claim 6, wherein the flash memory chip and the controller chip are comprised in one package.

8. A redundancy method for defective memory cells of a memory region of a flash memory, comprising:
   transmitting redundancy information related to the defective memory cells to a controller from the flash memory when power is input to the controller, wherein the redundancy information is stored in both the flash memory and the controller for controlling the flash memory, and the redundancy information comprises address information of defective memory cells, and redundant addresses of memory cells for compensating for the defective memory cells; and
   when performing data write-in and data read-out on the flash memory, controlling read-out data and data to be written-in according to the redundancy information by the controller.

9. The redundancy method as claimed in claim 8, wherein the controller replaces data of the defective memory cells with data of redundant memory cells according to the redundancy information.

10. The redundancy method as claimed in claim 8, wherein data read-out from a page of the flash memory comprises data of memory cells of a memory region and data of memory cells of a redundant memory region, and the page data is continuously read-out from a data register and provided to the controller.

11. The redundancy method as claimed in claim 8, wherein when performing write-in operation of the flash memory, the controller forms page data according to the redundancy information and transmits the formed page data to the flash memory, wherein the flash memory continuously inputs the page data to a data register and provides the input page data to memory cells of a memory region and memory cells of a redundant memory region through each bit line.

* * * * *

UNITED STATES PATENT AND TRADEMARK OFFICE
CERTIFICATE OF CORRECTION

PATENT NO. : 9,076,531 B2  
APPLICATION NO. : 13/846583  
DATED : July 7, 2015  
INVENTOR(S) : Kenichi Arakawa Page 1 of 1

It is certified that error appears in the above-identified patent and that said Letters Patent is hereby corrected as shown below:

Title page, item 71 the name of the Applicant is incorrect and should be changed from "Nuvoton Technology Corporation" to --Winbond Electronics Corp.--.

Signed and Sealed this
Eighth Day of December, 2015

Michelle K. Lee
*Director of the United States Patent and Trademark Office*